(12) United States Patent
Lee

(10) Patent No.: US 9,128,120 B2
(45) Date of Patent: Sep. 8, 2015

(54) PROBE

(75) Inventor: Chae Yoon Lee, Busan (KR)

(73) Assignee: LEENO INDUSTRIAL INC., Busan (KR)

(*) Notice: Subject to any disclaimer, the term of this patent is extended or adjusted under 35 U.S.C. 154(b) by 304 days.

(21) Appl. No.: 13/807,108

(22) PCT Filed: Sep. 10, 2010

(86) PCT No.: PCT/KR2010/006168
§ 371 (c)(1),
(2), (4) Date: Dec. 27, 2012

(87) PCT Pub. No.: WO2012/002612
PCT Pub. Date: Jan. 5, 2012

(65) Prior Publication Data
US 2013/0099811 A1  Apr. 25, 2013

(30) Foreign Application Priority Data

Jun. 30, 2010 (KR) .................. 10-2010-0063058

(51) Int. Cl.
*G01R 1/067* (2006.01)
*G01R 1/04* (2006.01)

(52) U.S. Cl.
CPC ............ *G01R 1/067* (2013.01); *G01R 1/06722* (2013.01); *G01R 1/0483* (2013.01)

(58) Field of Classification Search
USPC .................................. 324/754.11
See application file for complete search history.

(56) References Cited

U.S. PATENT DOCUMENTS

| 4,659,987 A | 4/1987 | Coe et al. |
| 6,396,293 B1 | 5/2002 | Vinther et al. |
| 2002/0000821 A1* | 1/2002 | Haga et al. .................. 324/761 |
| 2002/0075027 A1* | 6/2002 | Hollman et al. ............. 324/765 |
| 2009/0189622 A1 | 7/2009 | Tan |

FOREIGN PATENT DOCUMENTS

| CN | 101305285 | 11/2008 |
| JP | 2004-279141 | 10/2004 |
| JP | 2004-296301 | 10/2004 |
| JP | 2005-114547 | 4/2005 |

(Continued)

OTHER PUBLICATIONS

Masao, JP2004-279141, Machine Translation, JPO, p. 1-20.*

(Continued)

*Primary Examiner* — Thomas F Valone
(74) *Attorney, Agent, or Firm* — Kile Park Reed & Houtteman PLLC

(57) ABSTRACT

Disclosed is a probe which stably transmits a test signal. The probe electrically connects a semiconductor device and a tester for testing the semiconductor device. The probe may include an upper plunger which is configured to be electrically connected to the semiconductor device; a lower plunger which is configured to be electrically connected to the tester; an elastic member which is disposed between the upper plunger and the lower plunger, and elastically biases the upper and lower plungers to have them spaced from each other; a conductive member which is disposed in an inside or outside of the elastic member and electrically connects the upper plunger and the lower plunger; and a barrel which accommodates therein the upper plunger, the lower plunger, the elastic member and the conductive member.

5 Claims, 9 Drawing Sheets

(56) References Cited

FOREIGN PATENT DOCUMENTS

| | | |
|---|---|---|
| JP | 2006-153723 | 6/2006 |
| JP | 2010-135249 | 6/2010 |
| KR | 20-0260960 | 1/2002 |
| KR | 10-0659944 | 12/2006 |
| KR | 10-2009-0093738 | 2/2009 |
| KR | 10-2009-0093738 | 9/2009 |
| KR | 10-2009-0099157 | 9/2009 |
| TW | 200730832 | 8/2007 |
| TW | 200813437 | 3/2008 |

OTHER PUBLICATIONS

Yukimori, JP2005-114547, Machine Translation, JPO, p. 1-12.*
Taiwanese Office Action with English translation for Application No. 099132433 mailed Jul. 1, 2013.
Japanese Office Action with English Translation dated Mar. 12, 2014 for Japanese Application No. 2013-518211.
International Search Report of International Application No. PCT/KR2010/006168, dated Jun. 30, 2011.
Chinese Office Action with English Translation dated Dec. 31, 2014 for Chinese Application No. 201080067768.0.

* cited by examiner

PROBE

BACKGROUND

1. Field

Apparatuses and methods consistent with the exemplary embodiments relate to a probe, and more particularly, to a probe which stably transmits a test signal.

2. Description of the Related Art

A semiconductor device such as a semiconductor chip or a wafer undergoes a predetermined test to be tested for its quality.

A test socket or a probe card is used to electrically connect a tester testing the quality of a semiconductor device such as a semiconductor chip or a wafer by applying a predetermined test signal, and the semiconductor device.

The test socket or the probe card has a probe provided therein to apply the predetermined test signal to a solder ball of the semiconductor device or a pad.

A first end and a second end of the probe are connected to the semiconductor device and a load board of the tester, respectively, to electrically connect the semiconductor device and the tester.

The probe transmits the test signal (current or voltage) to the semiconductor device, and it is very important to stably transmit the test signal.

SUMMARY

Accordingly, one or more exemplary embodiments provide a probe which stably transmits a test signal.

Another exemplary embodiment is to provide a probe which has a simple configuration and improves conductivity.

Another exemplary embodiment is to provide a probe which reduces test costs.

The foregoing and/or other aspects may be achieved by providing by a probe which electrically connects a semiconductor device and a tester for testing the semiconductor device, the probe including: an upper plunger which is configured to be electrically connected to the semiconductor device; a lower plunger which is configured to be electrically connected to the tester; an elastic member which is disposed between the upper plunger and the lower plunger, and elastically biases the upper and lower plungers to have them spaced from each other; a conductive member which is disposed in an inside or outside of the elastic member and electrically connects the upper plunger and the lower plunger; and a barrel which accommodates therein the upper plunger, the lower plunger, the elastic member and the conductive member.

The conductive member may electrically connect the upper and lower plungers only when at least one of the upper plunger and the lower plunger moves toward the other one of the upper plunger and the lower plunger.

The conductive member may selectively contact at least one of the upper plunger and the lower plunger.

The conductive member may apply an elastic force to at least one of the upper plunger and the lower plunger to have them spaced from each other.

Effects of the Invention

The conductive member may comprise at least one of a conductive coil spring and a conductive rubber.

As described above, a probe according to the present invention has the following effects:

1) a test signal may stably be transmitted as an additional conductive member is provided in the probe;

2) a relatively simple configuration is available and conductivity may improve; and 3) test costs may be reduced.

BRIEF DESCRIPTION OF THE DRAWINGS

The above and/or other aspects will become apparent and more readily appreciated from the following description of the exemplary embodiments, taken in conjunction with the accompanying drawings, in which.

DETAILED DESCRIPTION OF EXEMPLARY EMBODIMENTS

Figure 1:
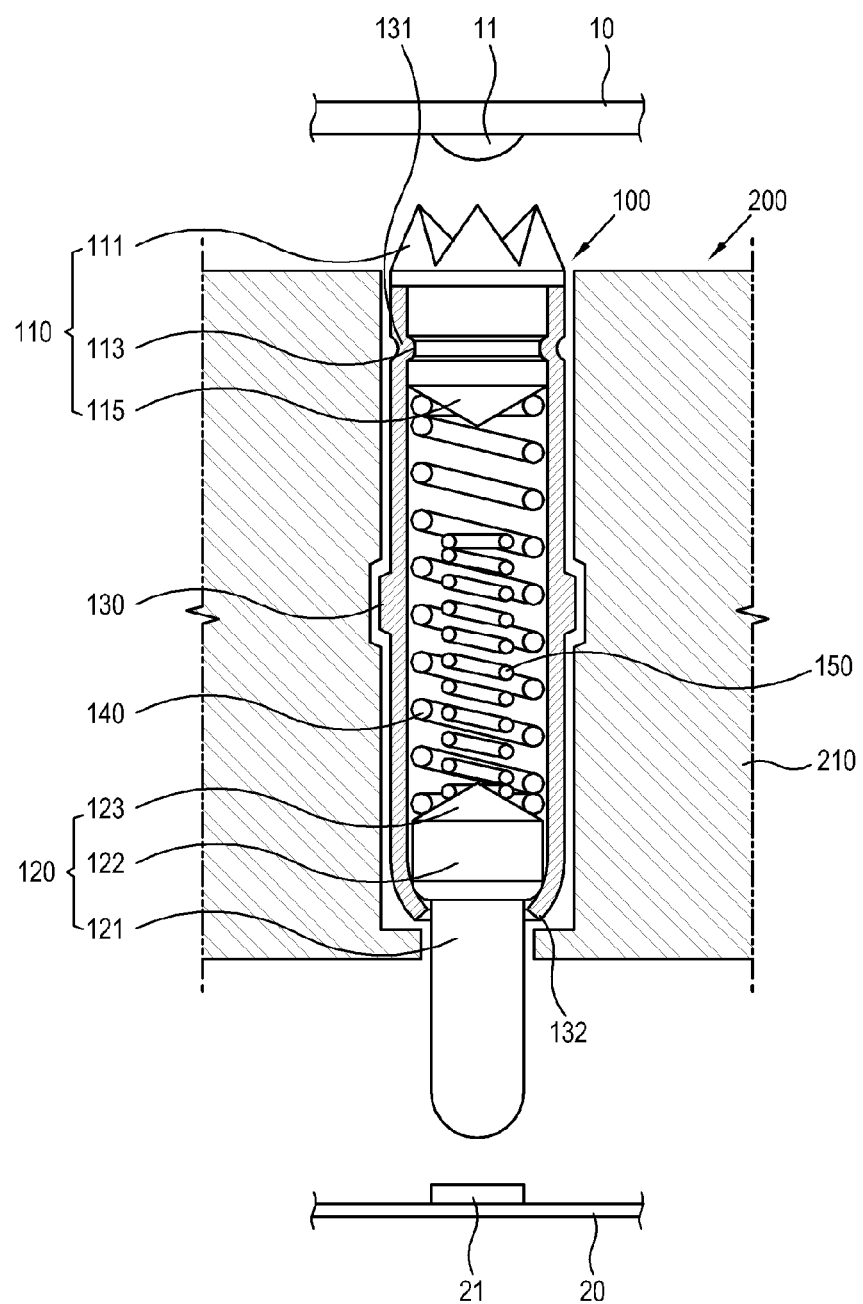
FIG. 1 is a schematic sectional view of a probe and a test socket accommodating the probe therein according to a first exemplary embodiment of the present invention.

Below, exemplary embodiments will be described in detail with reference to accompanying drawings so as to be easily realized by a person having ordinary knowledge in the art. The exemplary embodiments may be embodied in various forms without being limited to the exemplary embodiments set forth herein. Descriptions of well-known parts are omitted for clarity, and like reference numerals refer to like elements throughout.

As shown in FIG. 1, a probe 100 according to a first exemplary embodiment of the present invention includes an upper plunger 110; a lower plunger 120; an elastic member 140 elastically biasing the upper and lower plungers 110 and 120 to have them spaced from each other; a conductive member 150 provided within the elastic member 140; and a barrel 130 accommodating therein the upper and lower plungers 110 and 120, the elastic member 140 and the conductive member 150.

The upper plunger 110 includes a tip 111 contacting a solder ball 11 of a semiconductor device 10; a groove 113 formed in an external circumference of the upper plunger 110; and an elastic member contact 115 contacting the elastic member 140.

An external diameter of the tip 111 may be larger than an internal diameter of the barrel 130. A user may fix the upper plunger 110 to the barrel 130 by pushing the upper plunger 110 to the barrel 130 until the groove 113 holds a projection 131 of the barrel 130 (to be described later).

FIG. 1 illustrates the tip 111 which is shaped like a crown with a plurality of triangular pyramids formed thereon, but the shape of the tip 111 is not limited thereto. Alternatively, the shape of the tip 111 may vary depending on the shape of a contacting target. For example, if the semiconductor device 10 includes a semiconductor chip in a ball grid array, the tip 111 may be shaped like a crown as above. Also, the tip 111 may have an A-shape having a single sharp tip or a dimple shape whose inside is concave to insert the solder ball 11 thereinto. Further, the tip 111 may be shaped like a hemisphere such as a tip 121 of the lower plunger 120 (to be described later) if the contacting target is a pad.

The groove 113 of the upper plunger 110 is coupled to the projection 131 of the barrel 130. The upper plunger 110 is coupled to the barrel 130 so that the upper plunger 110 does not move up and down and is adhered thereto.

The elastic member contact 115 may be shaped like a cone protruding toward the lower plunger 120. In some cases, the elastic member contact 115 may be shaped like a cylinder into which the elastic member 140 is inserted. The elastic member contact 115 may have other various shapes as long as it may maintain a contact with the elastic member 140.

The upper plunger 110 may be formed as a single body.

The lower plunger 120 includes the tip 121 which contacts the pad 21 of the load board 20 of the tester; a main body 122 which is held by the tip 132 of the barrel 130; and an elastic member contact 123 which contacts the elastic member 140.

The tip 121 may be shaped like a hemisphere to easily contact the pad 21.

An external diameter D1 of the main body 122 is larger than an internal diameter D3 of the tip 132 of the barrel 130 and smaller than an internal diameter D2 of the barrel 130. Accordingly, the lower plunger 120 may be inserted through a second end of the barrel 130, and the main body 122 is held by the tip 132 so that the lower plunger 120 is not separated toward the load board 20.

The elastic member contact 123 may be shaped like a cone which protrudes toward the upper plunger 110. Otherwise, the elastic member contact 123 may be shaped like a cylinder into which the elastic member 140 may be inserted. The elastic member contact 123 may have other various shapes as long as it may maintain a contact with the elastic member 140.

The lower plunger 120 may be formed as a single body.

The barrel 130 accommodates therein the upper plunger 110, the lower plunger 120, the elastic member 140 and the conductive member 150.

The barrel 130 may be shaped like a cylinder whose upper side is open for the upper plunger 110 to be inserted thereinto.

The barrel 130 includes a projection 131 which is held by the groove 113 of the upper plunger 110; and the tip 132 which prevents the lower plunger 120 from being separated downward. If an external force larger than an elastic bias of the elastic member 140 is applied, the lower plunger 120 may move toward the upper plunger 110. The tip 132 acts as a stopper which regulates the downward movement of the lower plunger 120.

The barrel 130 accommodates therein the upper and lower plungers 110 and 120 to expose the tip 111 of the upper plunger 110 and the tip 121 of the lower plunger 120 to the outside.

The elastic member 140 is disposed between the upper plunger 110 and the lower plunger 120, and elastically biases the upper and lower plungers 110 and 120 to have them spaced from each other.

The elastic member 140 may include a conductive metal.

The conductive member 150 electrically connects the upper plunger 110 and the lower plunger 120.

A first end of the conductive member 150 contacts the elastic member contact 115 of the upper plunger 110, and a second end of the conductive member 150 contacts the elastic member contact 123 of the lower plunger 120.

The first end and the second end of the conductive member 150 maintain the contact with the elastic member contacts 115 and 123, regardless of the upward and downward movement of the lower plunger 120.

The conductive member 150 may apply an elastic force to at least one of the upper and lower plungers 110 and 120 in the direction in which the upper and lower plungers 110 and 120 are spaced from each other. As shown in FIG. 1, the conductive member 150 may be shaped like a coil spring. An external diameter of the conductive member 150 is smaller than an internal diameter of the elastic member 140. Thus, the conductive member 150 may be accommodated in the elastic member 140.

The conductive member 150 may include a conductive metal. In some case, the conductive member 150 may include a conductive rubber or a conductive plastic. The conductive rubber may have conductive properties as a non-conductive material such as silicon includes a plurality of conductive metal balls therein. The material of the conductive member 150 is not limited to the foregoing, and may include other various materials as long as it is conductive.

The conductive member 150 preferably has an electric conductivity equal to or higher than that of the barrel 130. The barrel 130 acts as a casing which accommodates the plungers 110 and 120, the elastic member 140 and the conductive member 150 and conducts electricity. Thus, a material which has a highly mechanical strength and good electric conductivity may be used for the barrel 130.

The conductive member 150 may be made of a material which has an electric conductivity equal to or higher than that of the elastic member 140.

The conductive member 150 may include the same material as the upper and lower plungers 110 and 120.

With the foregoing configuration, the probe 100 is accommodated in a socket housing 210.

The socket housing 210 accommodates therein, and supports, the probe 100 to expose the tip 111 of the upper plunger 110 and the tip 121 of the lower plunger 120 to the outside.

If a handler (not shown) which grips the semiconductor device 10 presses the semiconductor device 10 downward and has the solder ball 11 of the semiconductor device 10 contact the upper plunger 110, a test signal (current) is transmitted from the load board 20 to the semiconductor device 10 through the lower plunger 120 and the load board 20 which contact each other. Any shock which may arise from the downward pressure of the semiconductor device 10 may be absorbed by the elastic member 140.

The test signal (current) which is applied by the load board 20 of the tester is transmitted to the solder ball 11 of the semiconductor device 10 through the upper plunger 110 according to the following three paths:

1) First Path: the lower plunger 120 contacting the pad 21→the elastic member 140→the upper plunger 110;
2) Second Path: the lower plunger 120→the conductive member 150→the upper plunger 110; and
3) Third Path: the lower plunger 120 by the contact of the main body 122 of the lower plunger 120 and the tip 132 of the barrel 130→the barrel 130→the upper plunger 110.

The above three paths have the same configuration as a closed circuit which has three parallel circuits. Thus, the entire resistance value of the probe 100 is significantly reduced to stably transmit the test signal.

In the first exemplary embodiment of the present invention, the upper plunger 110 is adhered to the barrel 130, and the lower plunger 120 moves up and down with respect to the barrel 130, but not limited thereto. Alternatively, the upper plunger 110 may move up and down and the lower plunger 120 may be adhered to the barrel 130.

Figure 2:
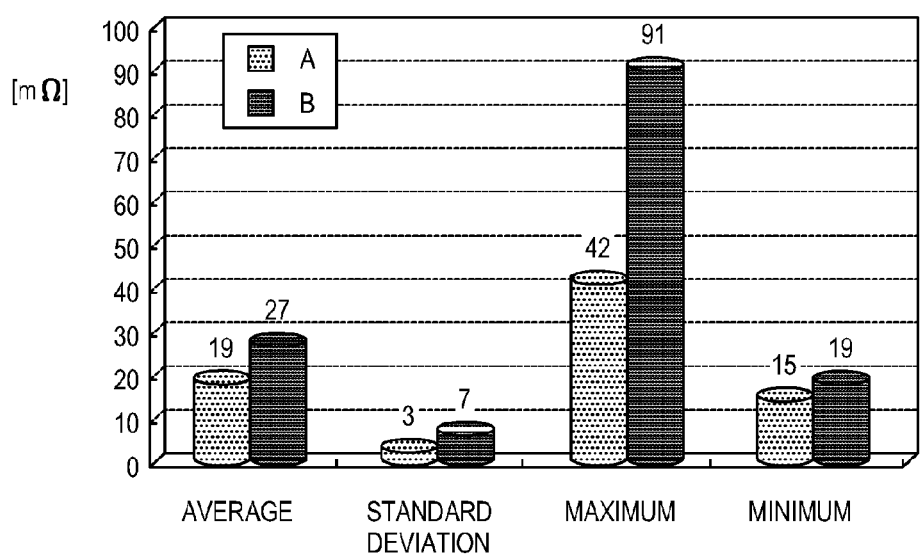
FIG. 2 illustrates a graph for comparison of resistance in the probe according to the first exemplary embodiment of the present invention.

FIG. 2 illustrates a graph which compares resistance values of the probe 100 according to the first exemplary embodiment of the present invention and a probe which does not have a conductive member 160 therein.

As shown in FIG. 1, the conductive member 160 includes a coil spring. The test was conducted for 100 probes, respectively.

For each probe, the total resistance value between the upper plunger and the lower plunger was measured, and the average and a standard deviation were calculated. The total resistance value means the sum of the resistance values from the three signal transmitting paths between the lower plunger and the upper plunger.

If the conductive material 160 does not exist ('B' in [Table 1]), the resistance value (mΩ) measured from 100 probes is maximum 90.8, minimum 18.9, average 27.3 and has a standard deviation of 7.0.

According to the first exemplary embodiment of the present invention, if the conductive member 160 exists ('A' in [Table 1]), the resistance value (mΩ) measured from the same number of probes is maximum 41.6, minimum 15.0, average 19.3 and has a standard deviation of 3.1.

The foregoing is summarized as a table as follows.

TABLE 1

| Measured Resistance [mΩ] | Average | Standard deviation | Maximum | Minimum |
| --- | --- | --- | --- | --- |
| A | 19.3 | 3.1 | 41.6 | 15.0 |
| B | 27.3 | 7.0 | 90.8 | 18.9 |

In summary, according to the first exemplary embodiment of the present invention, if the conductive member 160 is provided in the probe 100, the average resistance value decreases by approximately 30% and the standard deviation by 55% or more. That is, the probe 100 according to the first exemplary embodiment has a more stable resistance value and thus stably transmits the test signal between the tester and the semiconductor device.

Figure 3:
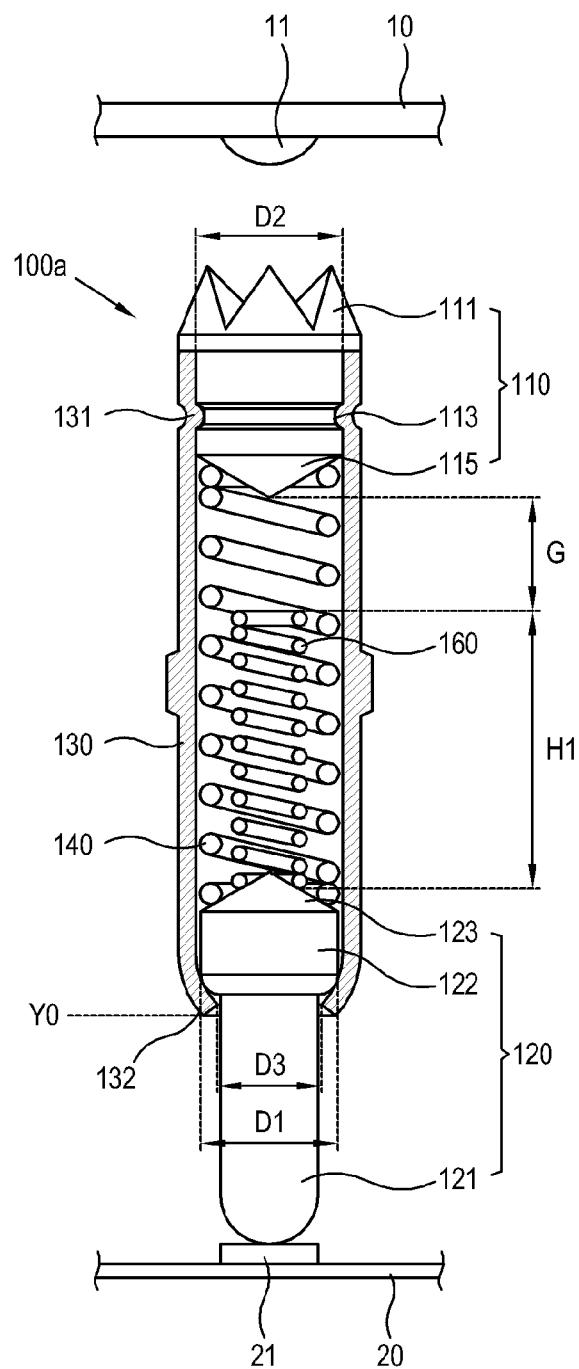
FIGS. 3 and 4 are longitudinal sectional views of a probe before and after receiving an external force according to a second exemplary embodiment of the present invention.
Figure 4:
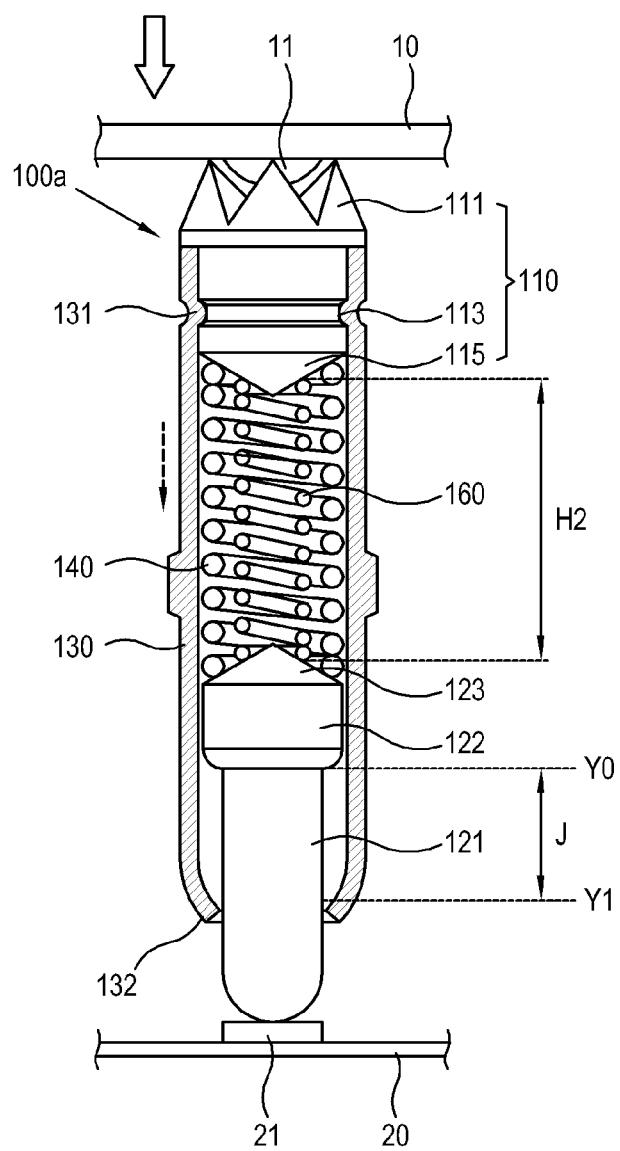
Figure 5:
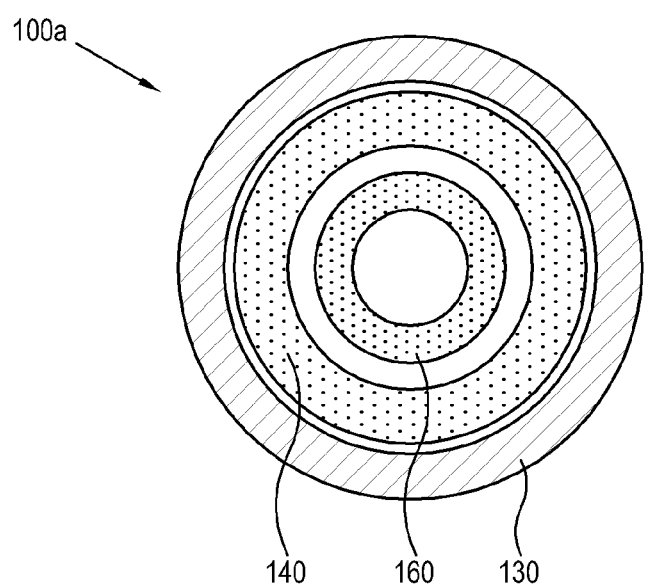
FIG. 5 is a cross-sectional view of the probe in FIG. 3.

As shown in FIGS. 3 to 5, a probe 100a according to a second exemplary embodiment of the present invention includes the upper plunger 110; the lower plunger 120; the elastic member 140; the conductive member 160; and the barrel 130.

In case of the conductive member 150 according to the first exemplary embodiment of the present invention, opposite ends of the conductive member 150 contact the upper and lower plungers 110 and 120, respectively. Meanwhile, at least one of opposite ends of the conductive member 160 according to the present exemplary embodiment does not contact the upper and lower plungers 110 and 120.

FIGS. 3 and 4 illustrate the conductive member 160 whose first end is spaced not to contact the upper plunger 110. However, opposite ends of the conductive member 160 may be spaced from the upper and lower plungers 110 and 120 and not in contact with them. In this case, the conductive member 160 may be supported by the barrel 130 through a connector (not shown) connected to the barrel 130.

As shown in FIG. 5, the conductive member 160 may be accommodated in the elastic member 140 since an external diameter of the conductive member 160 is smaller than an internal diameter of the elastic member 140.

A first end of the conductive member 160 is spaced from the upper plunger 110 as much as a predetermined gap G, and a second end thereof contacts the lower plunger 120.

Returning to FIG. 3, unless the semiconductor device 10 moves downward and the solder ball 11 contacts the upper plunger 110 and applies an external force to the probe 100a, the upper plunger 110 and the lower plunger 120 are spaced from each other by the elastic member 140. Accordingly, at least one of the opposite ends of the conductive member 160 is spaced from the upper and lower plungers 110 and 120 and does not contact them.

The conductive member 160 has a length H1 when not pressed.

A gap between the upper plunger 110 and the lower plunger 120 is G+H1.

As shown in FIG. 4, if an external force is applied to the probe 100a, the upper plunger 110 and the lower plunger 120 move and approach each other by overcoming the elastic bias of the elastic member 140. More specifically, since the upper plunger 110 is adhered to the barrel 130 and the lower plunger 120 is supported by the load board 20, the elastic member 140 is compressed and the upper plunger 110 and the barrel 130 move downward. Then, the elastic member contact 115 of the upper plunger 110 contacts the conductive member 160. Accordingly, the test signal (current) is transmitted from the load board 20 to the semiconductor device 10 through the conductive member 160, the elastic member 140 and the upper plunger 110.

That is, according to the second exemplary embodiment, the conductive member 160 simultaneously contacts the upper plunger 110 and the lower plunger 120 only when the semiconductor device 10 is being tested. If the test is not conducted, the conductive member 160 is spaced from both the upper and lower plungers 110 and 120 or from at least one of them and does not contact.

As the barrel 130 moves downward by a downward pressure of the semiconductor device 10, an internal side of the barrel 130 and an external surface of the lower plunger 120 contact each other, and a current transmitting path of the lower plunger 120, the barrel 130 and the upper plunger 110 is formed. Also, the path of the lower plunger 120, the elastic member 140 and the upper plunger 110, and the path of the lower plunger 120, the conductive member 160 and the upper plunger 110 are formed. Thus, the test signal may be transmitted more stably.

A movement distance J of the barrel 130 before and after the application of the external force is the same as the predetermined gap G between the conductive member 160 and the upper plunger 110 or larger than the gap G. The movement distance J falls under a difference between a location Y0 before the application of the external force to the tip 132 of the barrel and a location Y1 after the application of the external force.

That is, a gap H2 between the upper plunger 110 and the lower plunger 120 after the application of the external force is the same as the length H1 of the conductive member 160 or smaller than that (H2<H1).

Figure 6:
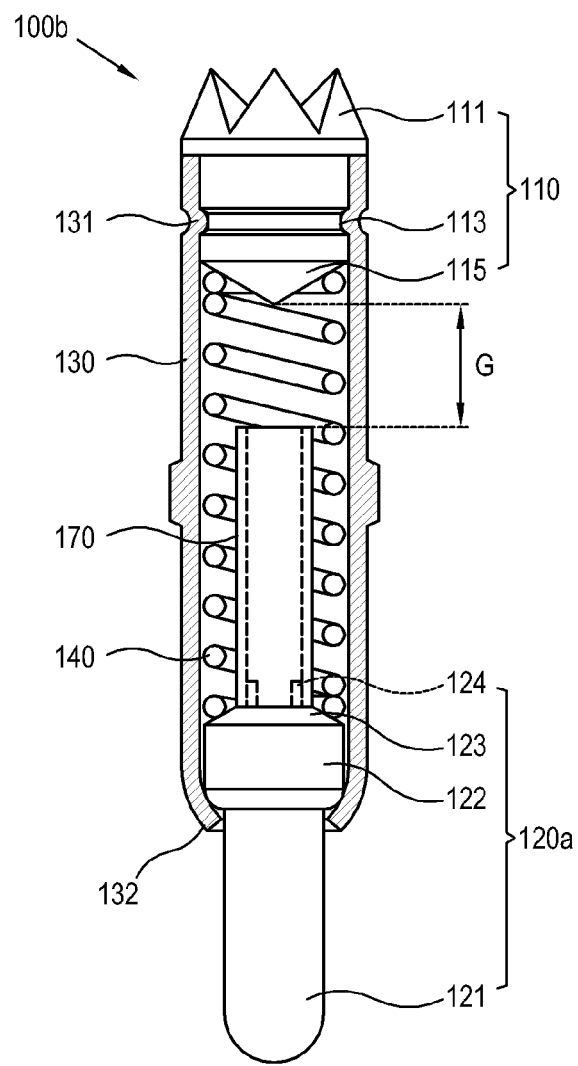
FIG. 6 is a schematic longitudinal sectional view of a probe according to a third exemplary embodiment of the present invention.

As shown in FIG. 6, a probe 110b according to a third exemplary embodiment of the present invention includes the upper plunger 110; the lower plunger 120; the elastic member 140; a conductive member 170; and a barrel 130 which accommodates the foregoing elements.

The conductive member 160 according to the second exemplary embodiment includes a coil spring, but the conductive member 170 according to the third exemplary embodiment may include a cylindrical tube, but not limited thereto. Alternatively, the conductive member 170 according to the present exemplary embodiment may have various shapes, e.g., triangular, rectangular or other polygonal shapes or an elliptical shape.

The lower plunger 120 may further include a projection 124 which protrudes toward the conductive member 170. The conductive member 170 which is shaped like a bar may pressedly be inserted into the projection 124.

The conductive member 170 may include a thin and highly conductive metal.

The conductive member 170 may include a conductive synthetic resin. The conductive synthetic resin may include a silicon resin or rubber having a plurality of metal balls therein to be conductive. The conductive member 170 may vary as long as it is conductive.

A projection (not shown) may be formed in the conductive member 170 and an insertion part (not shown) may be formed in the lower plunger 120 to pressedly insert the projection thereinto. The insertion part may include a groove or a projection.

Figure 7:
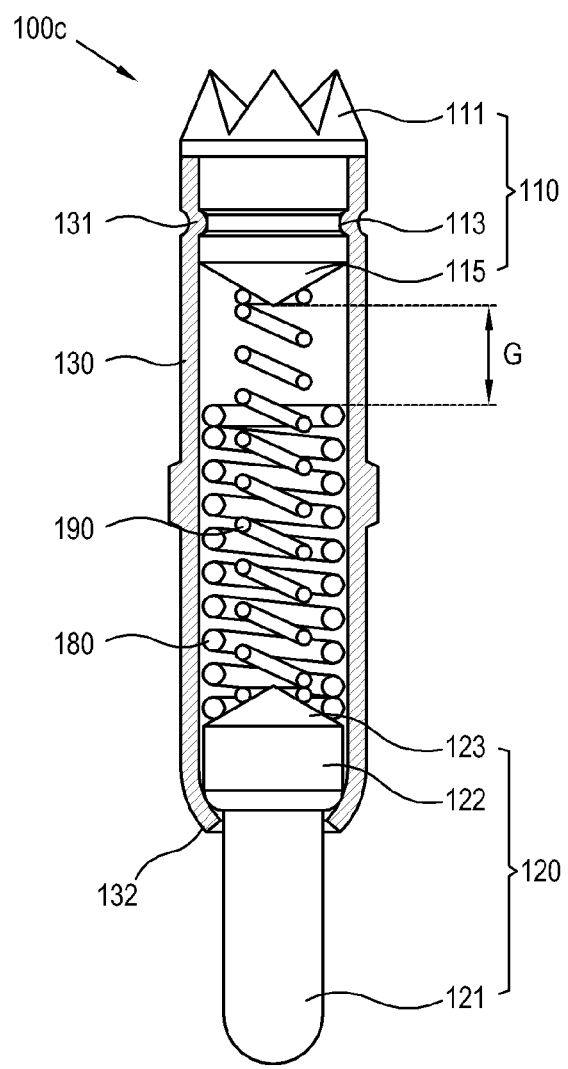
FIG. 7 is a schematic longitudinal sectional view of a probe according to a fourth exemplary embodiment of the present invention.

As shown in FIG. 7, a probe 100c according to a fourth exemplary embodiment of the present invention includes the upper plunger 110; the lower plunger 120; an elastic member 190; a conductive member 180; and the barrel 130 which accommodates therein the foregoing elements.

Opposite ends of the elastic member 190 contact the upper and lower plungers 110 and 120 and elastically biases the plungers 110 and 120 to have them spaced from each other.

The conductive member 180 is provided in an outside of the elastic member 190. That is, an internal diameter of the conductive member 180 is larger than an external diameter of the elastic member 190.

A first end of the conductive member 180 is spaced from the upper plunger 110 as much as a predetermined gap G, and a second end thereof contacts the lower plunger 120. When an external force is applied, the opposite ends of the conductive member 180 may be spaced from the upper and lower plungers 110 and 120. If the external force is applied, i.e., only when the semiconductor device 10 moves downward and presses the upper plunger 110, the gap between the upper and lower plungers 110 and 120 is reduced and the opposite ends of the conductive member 180 may contact the upper and lower plungers 110 and 120.

Figure 8:
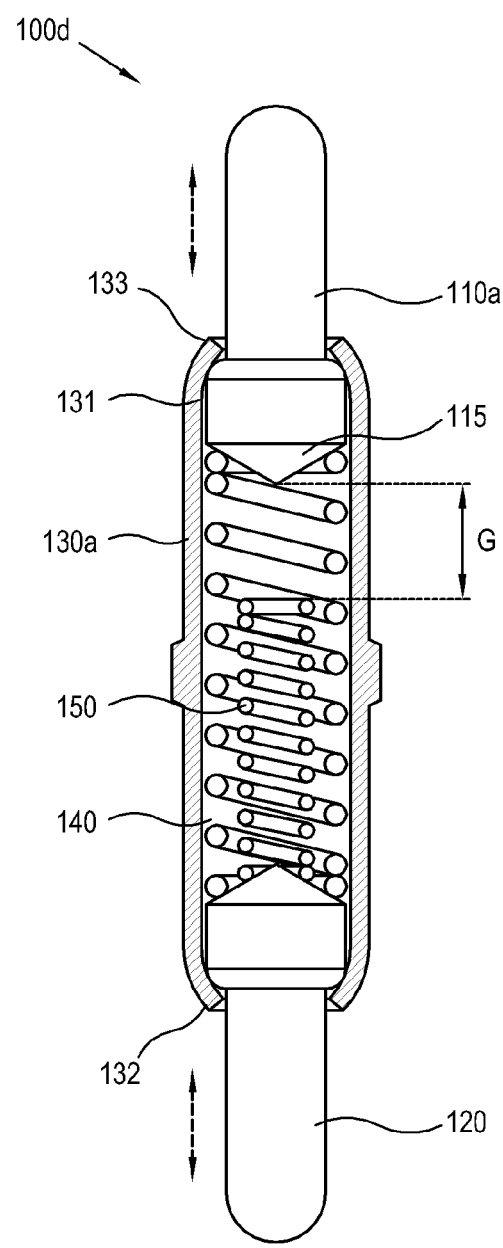
FIG. 8 is a schematic longitudinal sectional view of a probe according to a fifth exemplary embodiment of the present invention.

As shown in FIG. 8, a probe 100d according to a fifth exemplary embodiment of the present invention includes an upper plunger 110a which moves up and down; the lower plunger 120; the elastic member 140 which elastically biases the upper and lower plungers 110a and 120 to have them spaced from each other; the conductive member 150; and a barrel 130a.

While the upper plungers 110 according to the first through fourth exemplary embodiments are adhered to the barrel 130, the upper plunger 110a according to the present exemplary embodiment may move up and down with respect to the barrel 130a.

The barrel 130a movably accommodates therein the upper plunger 110a and the lower plunger 120.

The barrel 130a further includes a tip 133 which is inwardly bent to prevent the upper plunger 110a from being separated upward.

Upon receiving a pressure, the upper plunger 110a moves downward, and a conic elastic member contact 115 of the upper plunger 110a contacts the conductive member 150. Accordingly, the test signal (current) is transmitted to the upper plunger 110a through the lower plunger 120, the barrel 130a, the conductive member 150 and the elastic member 140.

Figure 9:
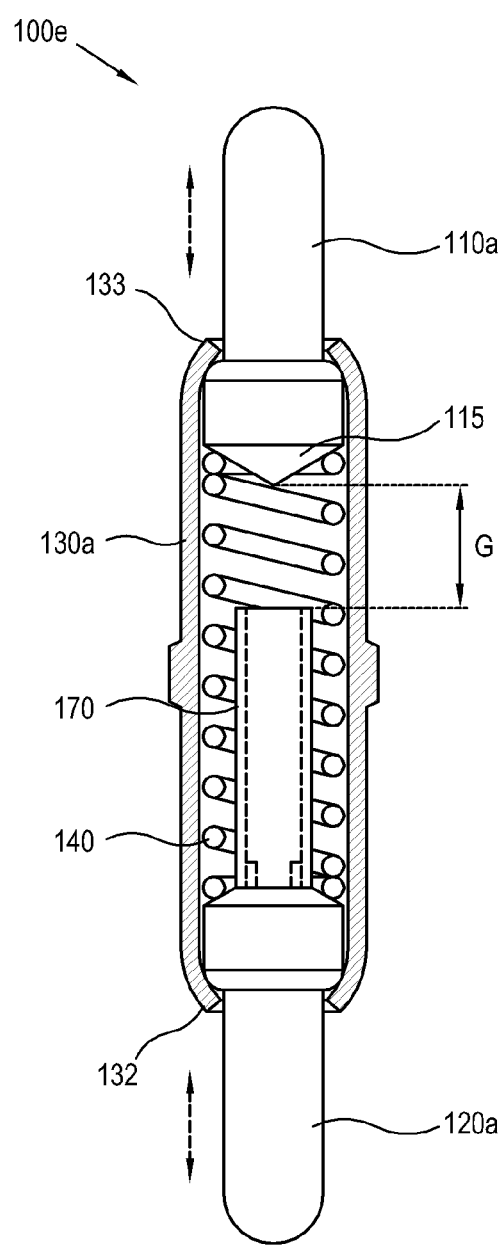
FIG. 9 is a schematic longitudinal sectional view of a probe according to a sixth exemplary embodiment of the present invention.

As shown in FIG. 9, a probe 100e according to a sixth exemplary embodiment of the present invention includes an upper plunger 110a which moves up and down; the lower plunger 120; the elastic member 140 which elastically biases the upper and lower plungers 110a and 120 to have them spaced from each other; the conductive member 170; and the barrel 130a.

Although a few exemplary embodiments have been shown and described, it will be appreciated by those skilled in the art that changes may be made in these exemplary embodiments without departing from the principles and spirit of the invention, the scope of which is defined in the appended claims and their equivalents.

What is claimed is:

1. A probe which electrically connects a semiconductor device and a tester for testing the semiconductor device, the probe comprising:
    an upper plunger which is configured to be electrically connected to the semiconductor device;
    a lower plunger which is configured to be electrically connected to the tester;
    an elastic member which is disposed between the upper plunger and the lower plunger, and elastically biases the upper and lower plungers to have them spaced from each other;
    a conductive member which is disposed in an inside or outside of the elastic member and electrically connects the upper plunger and the lower plunger; and
    a barrel which accommodates therein the upper plunger, the lower plunger, the elastic member and the conductive member,
    wherein upon non-testing, the conductive member is not contacted with one of the upper plunger and the lower plunger,
    wherein upon testing, the conductive member is contacted with the upper plunger and the lower plunger so that a conductive path is formed among the upper plunger, the conductive member and the lower plunger.

2. The probe according to claim 1, wherein the conductive member electrically connects the upper and lower plungers only when at least one of the upper plunger and the lower plunger moves toward the other one of the upper plunger and the lower plunger.

3. The probe according to claim 1, wherein the conductive member selectively contacts at least one of the upper plunger and the lower plunger.

4. The probe according to claim 3, wherein the conductive member applies an elastic force to at least one of the upper plunger and the lower plunger to have them spaced from each other.

5. The probe according to claim 4, wherein the conductive member comprises at least one of a conductive coil spring and a conductive rubber.

* * * * *